United States Patent
Wei

(10) Patent No.: US 8,427,831 B2
(45) Date of Patent: Apr. 23, 2013

(54) SERVER SYSTEM WITH HEAT DISSIPATION APPARATUS

(75) Inventor: Chao-Ke Wei, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 348 days.

(21) Appl. No.: 12/972,509

(22) Filed: Dec. 19, 2010

(65) Prior Publication Data

US 2012/0057298 A1  Mar. 8, 2012

(30) Foreign Application Priority Data

Sep. 2, 2010 (TW) .................................. 99129638

(51) Int. Cl.
*H05K 7/20* (2006.01)
*F25D 23/12* (2006.01)
*H05K 5/00* (2006.01)
*F28F 7/00* (2006.01)

(52) U.S. Cl.
USPC ... 361/699; 361/727; 361/679.5; 361/679.53; 62/259.2; 454/184; 165/80.4; 165/80.5; 165/104.33

(58) Field of Classification Search .................. 361/699, 361/724–727, 679.46–679.54; 454/184; 165/80.2–80.5, 104.33, 185
See application file for complete search history.

(56) References Cited

U.S. PATENT DOCUMENTS

| | | | |
|---|---|---|---|
| 6,672,955 B2 * | 1/2004 | Charron | 454/184 |
| 7,971,446 B2 * | 7/2011 | Clidaras et al. | 62/259.2 |
| 8,300,402 B2 * | 10/2012 | Wei | 361/679.47 |
| 8,331,087 B2 * | 12/2012 | Wei | 361/679.5 |
| 2008/0055846 A1 * | 3/2008 | Clidaras et al. | 361/687 |
| 2009/0241578 A1 * | 10/2009 | Carlson et al. | 62/259.2 |
| 2012/0075794 A1 * | 3/2012 | Wei et al. | 361/679.48 |
| 2012/0077427 A1 * | 3/2012 | Wei | 454/184 |

* cited by examiner

*Primary Examiner* — Zachary M Pape
(74) *Attorney, Agent, or Firm* — Altis Law Group, Inc.

(57) ABSTRACT

An exemplary server system includes a server cabinet defining a space therein; a number of racks arranged in the space, a number of servers mounted in the racks, and a heat dissipation apparatus arranged under the racks. A channel is defined between the racks. Each of the servers includes a drawing fan. The heat dissipation apparatus includes a fan module and two heat exchangers respectively arranged at opposite sides of the fan module. The fan module is aligned with the channel for generating upward a flow of cooling air upward to the channel. During operation of the server system, the cooling air is drawn across the servers by the drawing fans to evacuate heat from the servers and becomes heated air, and the heated air flows down to the heat exchangers where the heat is dissipated from the heated air such that the heated air become the cooling air again.

10 Claims, 2 Drawing Sheets

SERVER SYSTEM WITH HEAT DISSIPATION APPARATUS

CROSS REFERENCE TO RELATED APPLICATIONS

This application is related to two co-pending applications respectively entitled "SERVER SYSTEM WITH HEAT DISSIPATION DEVICE" Ser. No. 12/972,495 and "SERVER SYSTEM WITH HEAT DISSIPATING DEVICE" Ser. No 12/972,491, assigned to the same assignee of this application and filed on the same date as this application. The two related applications are incorporated herein by reference.

BACKGROUND

1. Technical Field

The present disclosure relates to heat dissipation from electronic apparatuses, and more particularly to a server system utilizing a heat dissipation apparatus.

2. Description of Related Art

A server system often includes a number of standard servers stacked in a standard server cabinet. Each of the servers typically includes at least a power supply device, a motherboard, a hard disk drive, and an optical disk drive, all of which can generate considerable heat during operation. The servers may suffer damage if the heat is not efficiently removed.

What is needed, therefore, is a solution which can overcome the limitations described.

DETAILED DESCRIPTION

Figure 1:
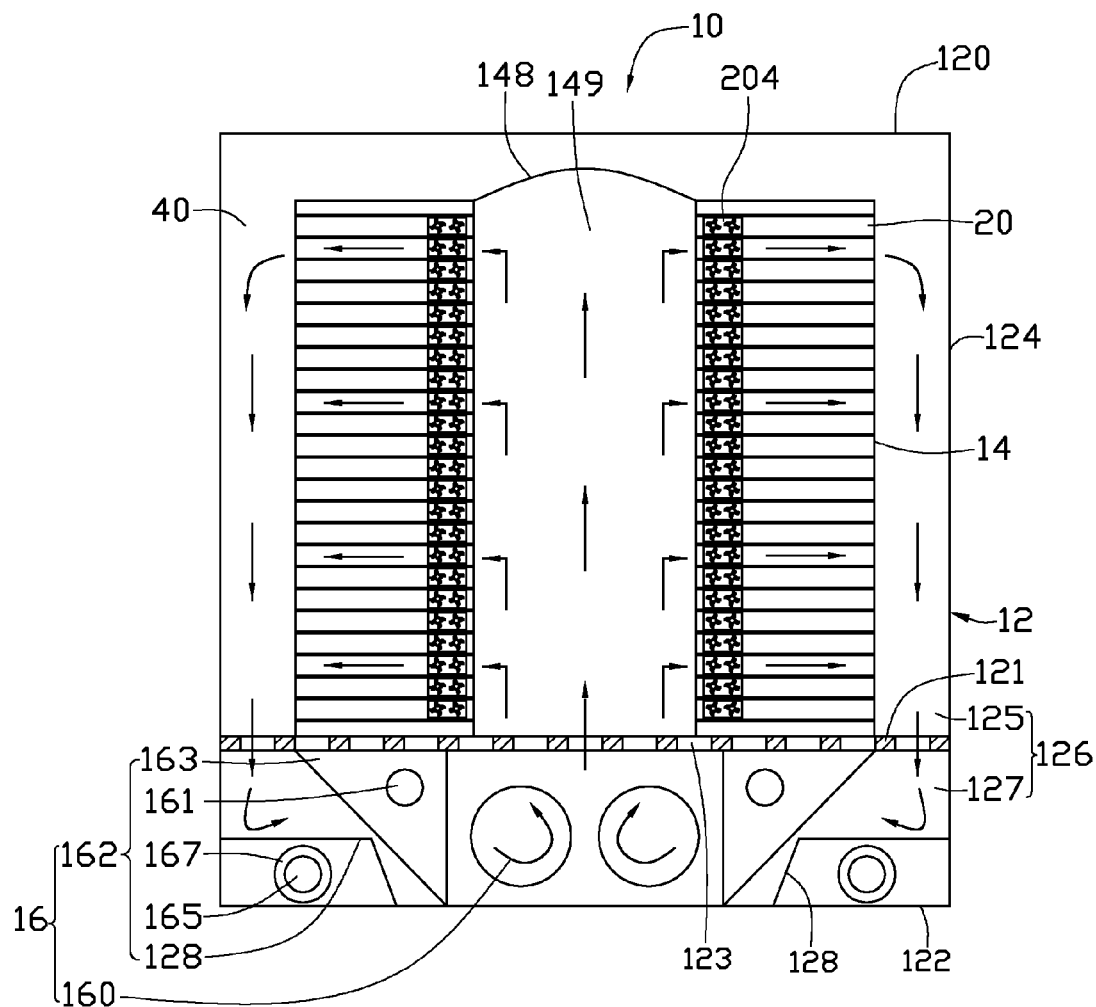
FIG. 1 is a schematic side view of a server system in accordance with an embodiment of the disclosure.

Referring to FIG. 1, a server system 10 in accordance with an exemplary embodiment is shown. The server system 10 includes a server cabinet 12, a number of racks 14 accommodated in the server cabinet 12, a number of servers 20 mounted in the racks 14, and a heat dissipation apparatus 16 cooling the servers 20.

The server cabinet 12 includes a top plate 120, a bottom plate 122 under the top plate 120, and two end plates 124 respectively interconnecting front and rear edges of the top and bottom plates 120 and 122. The top plate 120, the bottom plate 122, and the end plates 124 cooperatively define a space 126 in the server cabinet 12.

A support plate 121 is arranged in the space 126 of the server cabinet 12. In this embodiment, the support plate 121 is substantially parallel to the top and bottom plates 120 and 122, but is much closer to the bottom plate 122. Front and rear sides of the support plate 121 are respectively joined to the two end plates 124.

The support plate 121 separates the space 126 of the server cabinet 12 into an upper portion 125 over the support plate 121 and a lower portion 127 under the support plate 121. The upper portion 125 is taller than the lower portion 127. A number of ventilation holes 123 are defined in the support plate 121. The ventilation holes 123 intercommunicate the upper portion 125 and the lower portion 127.

The racks 14 are arranged in the upper portion 125 of the space 126 of the server cabinet 12, with each of pairs of racks 14 located between the two end plates 124. Each of the racks 14 is shorter than the upper portion 125 of the space 126. Thus, a top of each of the racks 14 is spaced a predetermined distance from the top plate 120 of the server cabinet 12.

In this embodiment, the server cabinet 12 receives only one pair of racks 14 therein. A channel 149 is defined between the two racks 14, and a passage 40 is defined between each of the end plates 124 and one corresponding neighboring rack 14. A sealing plate 148 is connected between the tops of the racks 14, thereby sealing a top of the channel 149. In this embodiment, the sealing plate 148 is convex.

Figure 2:
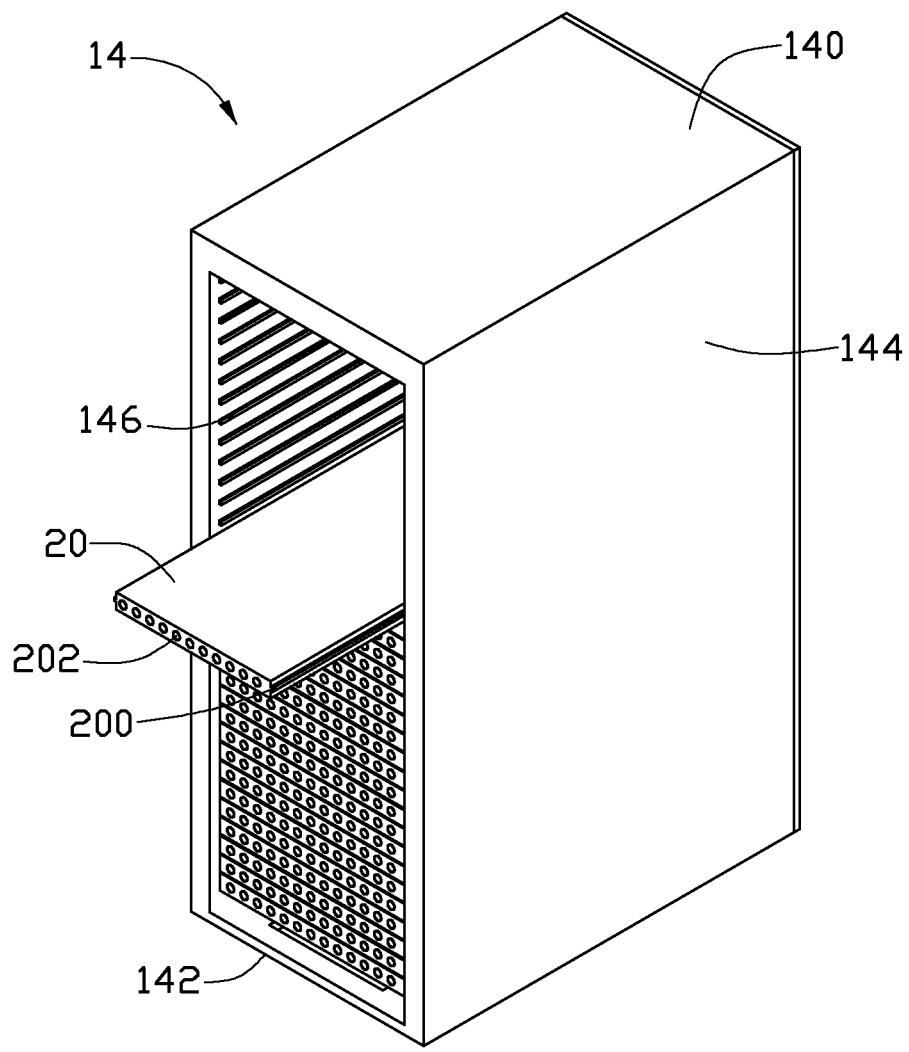
FIG. 2 is a schematic isometric view of a rack of the server system of FIG. 1 with a number of servers mounted therein.

Referring also to FIG. 2, each rack 14 includes a rectangular top board 140, a bottom board 142 parallel to and spaced from the top board 140, and two sidewalls 144 respectively interconnected between left and right sides of the top and bottom boards 140 and 142. That is, front and rear sides of the rack 14 are open. After the rack 14 is assembled into the server cabinet 12, the sidewalls 144 are arranged perpendicular to the end plates 124, and the front and rear open sides of the rack 14 face the channel 149 and the corresponding passage 40, respectively.

A plurality of sliding rails 146 is formed on inner sides of the sidewalls 144 of each rack 14, for facilitating installation of the servers 20. The sliding rails 146 are evenly distributed along a vertical axis of the rack 14. The servers 20 are stacked in each rack 14 along the vertical axis. Each server 20 has two guiding bars 200 respectively formed at left and right sides thereof, matching the sliding rails 146 of the rack 14. When assembled, the guiding bars 200 of the servers 20 slide along the respective sliding rails 146, allowing the servers 20 to slide into the rack 14.

Each server 20 defines a number of through holes 202 therein. In this embodiment, the through holes 202 extend through the server 20 from a rear side to a front side for ventilation. Further, each server 20 has a number of drawing fans 204 arranged adjacent to the through holes 202. After assembly, the drawing fans 204 are oriented in such a manner that air inlets thereof face the channel 149 while air outlets thereof face the through holes 202, thereby drawing air from the channel 149 to the through holes 202 to evacuate heat from the servers 20.

Referring to FIG. 1 again, the heat dissipation apparatus 16 is disposed in the lower portion 127 of the space 126 of the server cabinet 12. The heat dissipation apparatus 16 includes a fan module 160 generating cooling air to evacuate heat from the servers 20, and two heat exchangers 162 for dissipating the heat of the servers 20 to the exterior. In this embodiment, the fan module 160 includes two fans arranged with air outlets thereof aligned with the channel 149. The fans of the fan module 160 can be centrifugal fans or crossflow fans.

The heat exchangers 162 are arranged at opposite sides of the fan module 160, respectively. Preferably, the heat exchangers 162 are cold water heat exchangers. Each of the heat exchangers 162 includes an inlet pipe 161, an outlet pipe 165 connected with the inlet pipe 161, a number of absorbing fins 163 each arranged around the inlet pipe 161, a number of dissipating fins 167 each arranged around the outlet pipe 165, and a heat insulating plate 128.

Each of the inlet pipes 161 with the absorbing fins 163 arranged thereon is disposed under one corresponding rack 14, and is adjacent to an air inlet of one corresponding fan of the fan module 160. The inlet pipe 161 is configured for accepting cold water. The outlet pipe 165 is configured for expelling warm water, and is arranged below the inlet pipe 161. The heat insulating plate 128 is arranged between the absorbing fins 163 and the dissipating fins 167, and is adjacent to the dissipating fins 167.

During operation of the servers 20, heat is generated. The fan module 160 draws cooling air therearound up into the channel 149 through the ventilation holes 123 of the support plate 121, and synchronously, the drawing fans 204 of the servers 20 rotate to draw the cooling air from the channel 149 into the through holes 202 of the servers 20. When the cooling air flows through the through holes 202, it absorbs the heat of the servers 20 and helps keep the servers 20 at safe temperatures. Since the cooling air around the fan module 160 is drawn to the channel 149, pressure in other parts of the lower portion 127 of the space 126 is lowered, and the heated air flowing out the servers 20 flows down along the passages 40 to the lower portion 127 of the space 126.

Due to the arrangement of the heat insulating plates 128, the heated air flowing to the lower portion 127 is guided transversely across the absorbing fins 163 towards the fan module 160, during which heat from the heated air is absorbed by the absorbing fins 163 and transferred to the cold water flowing in the inlet pipes 161. After passing the absorbing fins 163 and releasing the heat, the heated air cools and thus the fan module 160 can provide cooling air continuously to the servers 20.

Synchronous, the cold water absorbing the heat warms and flows to the outlet pipes 165. While the warm water flows through the outlet pipes 165, the heat of the warm water is dissipated to the outlet pipes 165 and finally to the exterior by the dissipating fins 167 around the outlet pipes 165. Thus the warm water cools, to again can be provided to the inlet pipes 165 for absorbing heat of the heated air across the absorbing fins 163. Heat is thus evacuated from the servers 20 continuously, and the servers 20 maintain a low working temperature.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A server system, comprising: a server cabinet defining a space therein; a plurality of racks received in the space of the server cabinet, a channel defined between the racks; a plurality of servers mounted in the racks, each of the servers comprising a drawing fan; and a heat dissipation apparatus arranged under the racks, the heat dissipation apparatus comprising a fan module and two heat exchangers respectively arranged at opposite sides of the fan module, the fan module aligned with the channel for generating a flow of cooling air upward to the channel; wherein during operation of the server system, the cooling air is drawn across the servers by the drawing fans to evacuate heat from the servers and become heated air, and the heated air flows down to the heat exchangers where the heat is dissipated from the heated air such that the heated air becomes the cooling air again, wherein each heat exchanger comprises an inlet pipe adapted for injecting cold water, a plurality of absorbing fins formed around the inlet pipe, and an outlet pipe connected to the inlet pipe, and wherein during operation of the servers, the heated air flows through the absorbing fins of the heat exchangers and dissipates the heat to the absorbing fins and thus cools, while the cold water flows through the inlet pipes and absorbs the heat of the absorbing fins and warms, flowing to the outlet pipes for dissipating the heat to the exterior, wherein each of the heat exchangers further comprises a plurality of dissipating fins mounted around the outlet pipe, whereby the heat of the warm water is transferred to the dissipating fins at the outlet pipe and finally dissipated to the exterior by the dissipating fins, wherein each of the heat exchangers further comprises a heat insulating plate disposed between the absorbing fins and the dissipating fins, the absorbing fins closer to the fan module.

2. The server system of claim 1, further comprising a sealing plate connected between tops of the racks and sealing a top of the channel.

3. The server system of claim 2, wherein the sealing plate is convex.

4. The server system of claim 1, wherein each heat exchanger is a cold water heat exchanger.

5. The server system of claim 1, wherein the outlet pipe is arranged below the inlet pipe.

6. The server system of claim 1, further comprising a support plate arranged in the space of the server cabinet and separating the space into an upper portion over the support plate and a lower portion under the support plate, a plurality of ventilation holes defined in the support plate to intercommunicate the upper portion and the lower portion, the racks received in the upper portion, while the heat dissipation apparatus received in the lower portion.

7. The server system of claim 6, wherein the server cabinet includes a top plate, a bottom plate under the top plate, and two end plates respectively interconnecting opposite lateral edges of the top and bottom plates, wherein the support plate is substantially parallel to the top and bottom plates.

8. The server system of claim 1, wherein a plurality of through holes extends through each of the servers, and the drawing fans are arranged in such a manner that air outlets thereof face the through holes while air inlets thereof face the channel.

9. A server system, comprising: a server cabinet comprising a top plate, a bottom plate, and two opposite end plates each extending between the top and bottom plates; a support plate connected between the end plates to divide an interior of the server cabinet into an upper portion over the support plate and a lower portion under the support plate, wherein a plurality of ventilation holes is defined in the support plate to intercommunicate the upper portion and the lower portion; two racks received in the upper portion between the end plates, a channel defined between the two racks, and a passage defined between each of the end plates and one corresponding neighboring rack; a plurality of servers mounted in the racks, each of the servers comprising a drawing fan; and a heat dissipation apparatus disposed in the lower portion, the heat dissipation apparatus comprising a fan module aligned with the channel and two heat exchangers respectively arranged under the two racks; wherein during operation of the server system and the servers, cooling air is drawn up from the lower portion to the channel by the fan module and moved across the servers by the drawing fans to exhaust heat from the servers such that the cooling air becomes heated, and the heated air flows down along the passages to the heat exchangers where the heat is dissipated from the heated air which thus becomes the cooling air again, wherein each heat exchanger comprises an inlet pipe adapted for injecting cold water, a plurality of absorbing fins formed around the inlet pipe, and an outlet pipe connected to the inlet pipe, and wherein during operation of the servers, the heated air flows through the absorbing fins of the heat exchangers and dissipates the heat to the absorbing fins and thus cools, while the cold water flows through the inlet pipes to absorb the heat of the absorbing fins and warms, flowing to the outlet pipes and dissipating heat thereat, wherein each heat exchanger further comprises a plurality of dissipating fins around the outlet pipe, the heat of the warm water is transferred to the dissipating fins at the outlet pipe and finally to the exterior by the dissipating fins, wherein each heat exchanger further comprises a heat insulating plate disposed between the absorbing fins and the dissipating fins, the absorbing fins closer to the fan module, the outlet pipe arranged below the inlet pipe. er to the fan module, the outlet pipe arranged below the inlet pipe.

10. The server system of claim 9, further comprising a convex sealing plate connected between tops of the racks and sealing a top of the channel.

* * * * *